United States Patent [19]

Sugiyama et al.

[11] Patent Number: 5,485,294

[45] Date of Patent: Jan. 16, 1996

[54] PROCESS FOR PRODUCING MIM ELEMENTS BY ELECTROLYTIC POLYMERIZATION

[75] Inventors: Jun Sugiyama; Tadashi Ota, both of Nagano, Japan

[73] Assignee: Seiko Epson Corporation, Tokyo, Japan

[21] Appl. No.: 771,878

[22] Filed: Oct. 3, 1991

Related U.S. Application Data

[63] Continuation of Ser. No. 286,543, Dec. 19, 1988, abandoned.

[30] Foreign Application Priority Data

| Dec. 18, 1987 | [JP] | Japan | 62-320483 |
| Dec. 18, 1987 | [JP] | Japan | 62-320485 |
| Oct. 19, 1988 | [JP] | Japan | 63-263063 |

[51] Int. Cl.⁶ ............... G02F 1/136; H01L 21/02
[52] U.S. Cl. ............... 359/58; 359/60; 204/181.1; 437/1
[58] Field of Search ............... 350/332, 334, 350/336, 339 R, 331 R; 437/1, 48, 49, 205; 29/25.02; 357/4, 8; 340/784; 359/58, 59, 60; 257/40; 204/181.1, 181.5, 181.6

[56] References Cited

U.S. PATENT DOCUMENTS

| 4,413,883 | 11/1983 | Baraff et al. | 350/333 |
| 4,523,811 | 6/1985 | Ota | 359/58 |
| 4,534,623 | 8/1985 | Azaki | 350/339 R |
| 4,572,615 | 2/1986 | Nickol et al. | 350/339 R |
| 4,653,858 | 3/1987 | Szydlo et al. | 350/332 |
| 4,683,183 | 7/1987 | Ono | 430/20 |
| 4,842,372 | 6/1989 | Toyama | 350/339 R |
| 4,861,141 | 8/1989 | Nakazawa | 350/334 |
| 4,871,234 | 10/1989 | Suzuki | 350/333 |
| 4,895,789 | 1/1990 | Motte et al. | 350/334 |
| 4,907,043 | 3/1990 | Uekita et al. | 357/4 |
| 4,939,556 | 7/1990 | Eguchi et al. | 357/4 |
| 4,944,575 | 7/1990 | Aigrain et al. | 350/333 |
| 5,107,308 | 4/1992 | Koezuka et al. | 357/23.2 |
| 5,122,889 | 6/1992 | Kaneko et al. | 359/87 |

FOREIGN PATENT DOCUMENTS

| 0241021 | 11/1985 | Japan | 350/339 R |
| 0045222 | 3/1986 | Japan | 359/58 |
| 61-163659 | 7/1986 | Japan . | |
| 61-163658 | 7/1986 | Japan . | |
| 62-183579 | 8/1987 | Japan . | |
| 0038920 | 2/1988 | Japan | 350/339 R |

OTHER PUBLICATIONS

S. Morozumi–"Active Matrix Displays" SID Seminar Lecture Notes–May 1989–pp. 10.2–10.29.

Castleberry–"Control Layers For Liquid Crystal Matrix Displays" 1980–Biennial Display Research Conference–IEEE–Oct. 1980–pp. 89–92.

Gregor, L. V., "Electrical Conductivity of Polydivinylbenzene Films", *Thin Solid Films*, 2 (1968) 235–246.

Hogarth, C. A. et al., "The Electrical and Structural Properties of Thin Films", Brunel Univ. Phys. Dept. (1981) pp. 11–37.

*Primary Examiner*—William L. Sikes
*Assistant Examiner*—Tai V. Duong
*Attorney, Agent, or Firm*—Stroock & Stroock & Lavan

[57] ABSTRACT

An active element such as a MIM element includes a first electrically conductive layer, a nonlinearly conductive layer having a low dielectric constant disposed on the first conductive layer and a second electrically conductive layer disposed on the nonlinearly conductive layer. The nonlinearly conductive layer can be deposited on the first conductive layer by electrolytic polymerization. A matrix of liquid crystal picture element electrodes driven by active elements in accordance with the invention can be formed with as little as two or three photolythographic steps.

13 Claims, 5 Drawing Sheets

PROCESS FOR PRODUCING MIM ELEMENTS BY ELECTROLYTIC POLYMERIZATION

This is a continuation of application Ser. No. 07/286,543, filed Dec. 19, 1988, now abandoned.

BACKGROUND OF THE INVENTION

The invention relates generally to an active element that is advantageously included in an electrooptical device and more particularly to an improved nonlinearly conducting metal-insulator-metal (MIM) type of active element in which the insulating layer is a nonlinearly conducting thin organic film and the active elements are arranged to form an active matrix.

Various types of conventional two-terminal and three-terminal active elements have been included in conventional electrooptical apparatuses that include an active matrix. For example, thin film transistors have been used as active elements but they are structurally complex and it is difficult to form a large a high density matrix that includes thin film transistors as the active element.

Because two-terminal active elements have a simpler structure and are easier to produce then three-terminal active elements, they can yield a less costly and simplified active matrix structure for an electrooptical apparatus. Two-terminal active elements having the simplest structure are formed by disposing a nonlinearly electrically conducting layer on a first electrically conducting layer and disposing a second electrically conducting layer on the nonlinearly electrically conducting layer. Conventionally, a metal is used as the first and second conducting layers and an insulating film is used to form the nonlinearly conducting layer. Consequently, this structure is generally referred to as a MIM (Metal-Insulator-Metal) structure and the element having the MIM structure is called a MIM element.

Throughout the application, the term "MIM" refers to a structure having a first conducting layer disposed on a substrate, a nonlinearly electrically conducting layer and a second conducting layer thereon. The types of materials and their characteristics need not be defined. The term "MIM element" represents an active element including the MIM structure.

It is known that it is advantageous to include MIM elements in electrooptical liquid crystal apparatuses. For example, the principals and advantages of such an apparatus and a method of producing the apparatus are discussed in Japanese Patent Publication No. 161273/70. The MIM element is an active element due to its nonlinear electroconductive characteristics.

Figures 3, 4A, 5A:
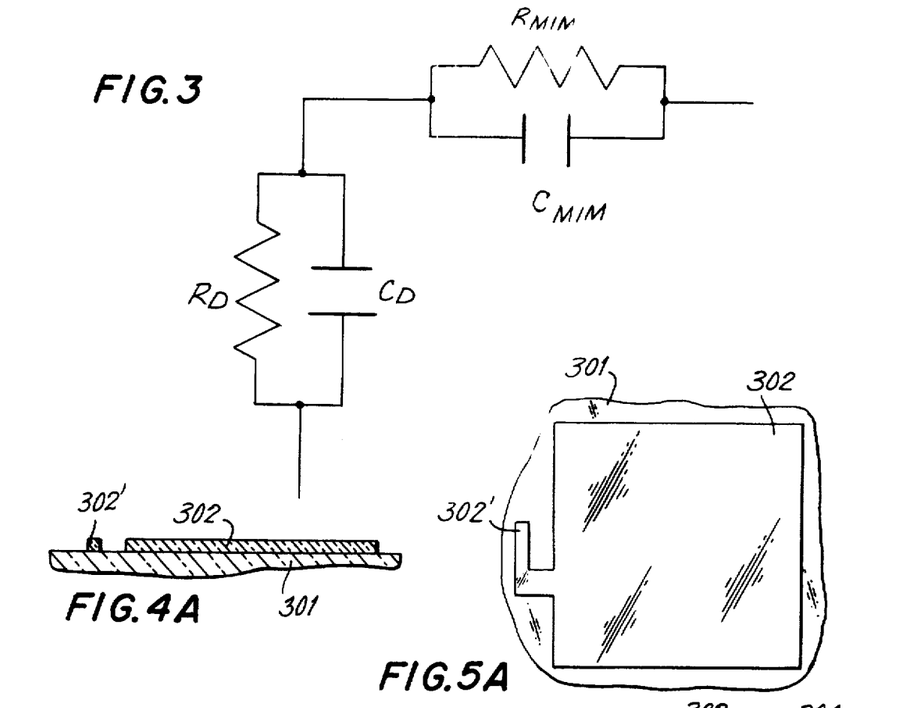
FIG. 3 shows the equivalent circuit for one active picture element including a MIM element constructed and arranged in accordance with the invention.
FIGS. 4A, 4B and 4C are sectional views illustrating steps of forming an active element in accordance with an embodiment of the invention.
FIGS. 5A, 5B and 5C are plan views illustrating the steps of forming the active element of FIGS. 4A, 4B and 4C.

FIG. 3 shows an equivalent circuit for a single picture element of an electrooptic apparatus that includes a MIM element. $C_{MIM}$ and $R_{MIM}$ represent the electrostatic capacity and the linear resistance, respectively, of the MIM element. $C_D$ and $R_D$ represent the resistance and capacity of the picture element of the liquid crystal. For proper performance of the MIM element, it is necessary that the capacity ratio "R" ($C_D/C_{MIM}$) not be less than 5 and preferably not less than 10. Accordingly, the electrostatic capacity of the MIM element must be small compared to the capacity of the electrooptical picture element.

The nonlinearly conducting layer of a conventional MIM element is a film of anodized metal, typically tantalum pentoxide formed by anodizing the surface of the first metal conducting layer. Since the $Ta_2O_5$ film has a relatively high dielectric constant, there are several disadvantages for its use, as follows:

1. A large voltage must be applied to the element and it is necessary to make the electrostatic capacity less then ⅕ of that of the liquid crystal, fine processes approaching physical limits are required.
2. Because the properties of the element (β value of Poole-Frankel) is inversely proportioned to the square root of the dielectric constant "ε" and the thickness of the film and, the liquid crystal display cannot be driven at less than ¼₀₀ to ⅕₀₀ duty.

To minimize the capacity of the MIM element, it is necessary to minimize the effective area of the MIM element. To form such a small element, it is necessary to utilize a relatively complex and costly technique such as photolithography of a minute pattern on a large substrate and/or only use the side surface of the metal electrode that forms the first conducting layer. These procedures reduce the margins for error and the manufacturing yield and increase the price of both liquid crystal devices that include MIM elements and the machinery needed to produce them.

The nonlinearity of the electrical conduction characteristics of the MIM can be represented as β from the Poole-Frankel equation. β is generally inversely proportional to the square root of the dielectric constant "ε" and the film thickness. Accordingly, materials having large dielectric constants also have inferior nonlinearity of electrical conduction. Consequently, the practical duty ratio at which a conventional MIM element can be driven in a liquid crystal electrooptical element is at most about ⅕₀₀.

Accordingly, it is desirable to develop an improved MIM element for an electrooptical apparatus including a nonlinear conduction layer which avoids these shortcomings of the prior art.

SUMMARY OF THE INVENTION

Generally speaking, in accordance with the invention, an active element, such as a MIM element in an electrooptical liquid crystal display device includes a first conductive layer, a thin film organic material having a low dielectric constant as the nonlinearly electrically conductive layer thereon and a second conductive layer on the nonlinear layer. An active matrix device including these MIM elements is formed by selectively depositing a first strip of electrically conductive material on a substrate, covering the first conducting strips with a nonlinearly electrically conducting thin organic film and depositing a second electrically conductive strip over the nonlinearly conducting thin organic film and forming a picture cell electrode adjacent to the conductive strips. In a preferred embodiment, the nonlinearly conducting thin organic film is deposited by electrolytic polymerization.

Accordingly, it is an object of the invention to provide an improved active element, such as a MIM.

It is another object of the invention to provide an improved MIM which is less expensive and simpler to form than conventional active elements.

Another object of the invention is to provide active elements having highly uniform properties.

A further object of the invention is to provide a nonlinearly conducting layer for an active element such as a MIM having a relatively low dielectric constant.

Still another object of the invention is to provide an active element such as a MIM for an electrooptical apparatus that can be driven at a high duty ratio and maintain a high contrast ratio.

Still a further object of the invention is to provide an active element such as a MIM having greater production error tolerances leading to fewer occurrences of defective active elements and less expensive formation techniques.

Still other objects and advantages of the invention will in part be obvious and will in part be apparent from the specifications and drawings.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

An active element constructed in accordance with the invention includes a first electrically conductive layer, a nonlinearly electrically conductive layer formed of a thin film having a relatively low dielectric constant disposed on the first conductive layer and a second conductive layer disposed on the nonlinearly conductive layer over the first conductive layer. One of the first or second electrically conductive thin films electrically contacts the element controlled by the active element. Such an active element, constructed in accordance with the invention, is a two terminal active element in which current can flow in opposite directions through the nonlinearly conductive material, depending on the polarity of the voltage across the nonlinearly conductive material.

An active electrooptical liquid crystal picture element constructed in accordance with the invention includes a first conducting strip formed on a substrate, a nonlinearly conducting thin organic film formed on the first conducting strip, a second conducting strip electrically connected to the picture cell electrode and disposed on the thin organic film and over the first conducting strip and a picture cell electrode adjacent to the conducting strips. The nonlinearly conducting active portion of the structure is a MIM element located at a position where the second conducting strip overlaps the first conducting strip with one of the first or second conducting thin films having electrical contact with the picture cell electrode.

To form an electrooptical active matrix in accordance with the invention, the following steps are performed:

1. depositing a conductive film on a substrate;
2. optionally depositing a second conductive film on the first conductive film, for example, the first film can be a metal film and the second film can be an electrically conductive oxide;
3. selectively photoetching through the same mask to yield a first conductive strip adjacent a picture element electrode;
4. selectively forming a nonlinearly electrically conductive thin organic film on the first conductive strip, for example, by a method such as an electrochemical method such as electrolytic polymerization or by spin coating the organic film and then removing the undesired portion;
5. depositing a second electrically conductive layer over the first conductive strip; and
6. selectively patterning a second conductive strip by photoetching and any of the excess second conductive film on the picture element electrode can be simultaneously removed.

The following examples are set forth to describe MIM elements and electrooptical apparatuses constructed in accordance with the invention more clearly. They are intended to be illustrative only and are not presented in a limiting sense. Throughout the application, similar structures illustrated in the figures will be identically numbered.

EXAMPLE 1

Figure 1A:
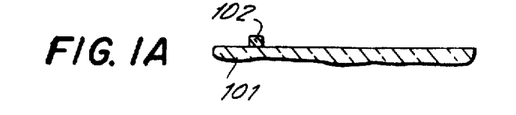
FIGS. 1A, 1B, 1C, 1D and 1E are sectional views illustrating steps of preparing an active element in accordance with the invention.
Figure 2A:
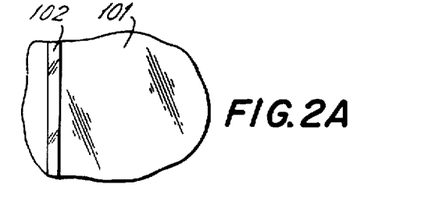
FIGS. 2A, 2B, 2C, 2D and 2E are plan views illustrating steps of preparing the active element of FIGS. 1A, 1B, 1C, 1D and 1E.

The steps for forming a liquid crystal electrooptical element in accordance with this first embodiment of the invention are illustrated generally in FIGS. 1A through 1E and FIGS. 2A through 2E. A 500 nm thick layer of nickel was deposited on a transparent soda-lime glass substrate 101. The nickel film was photoetched to yield a pattern for 220 terminal portions that are electrically connected to a portion outside of substrate 101 and 8 μm wide signal lines 102 for MIM elements as shown in FIG. 1A and FIG. 2A.

Figure 1B:
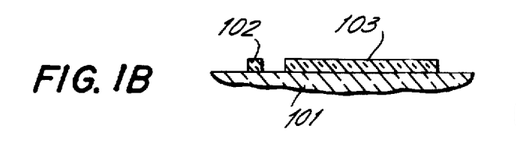
Figure 1C:
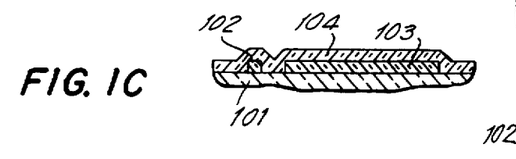
Figure 2B:
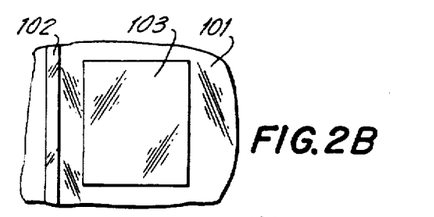
Figure 2C:
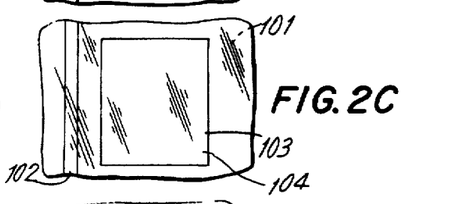

Indium tin oxide (ITO) was sputtered onto substrate 101 to a thickness of 30 nm and photoetched to yield a 320×220 matrix of 230 μm by 210 μm picture element electrodes 103 as shown in FIG. 1B and FIG. 2B. This substrate including the matrix of transparent picture element electrodes 103 adjacent signal lines 102 was used as a starting substrate for forming an active matrix in this and other examples unless specified otherwise.

Figure 1D:
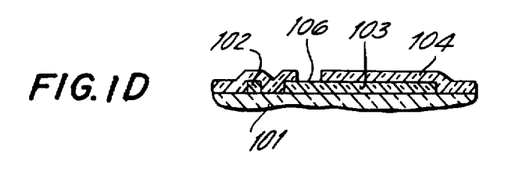
Figure 2D:
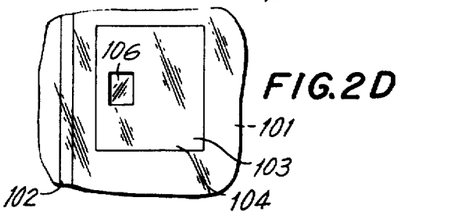

The starting substrate of transparent substrate 101 with first conducting strips 102 and picture element electrodes 103 was spin coated with a 30 nm thick film 104 of photosensitive polyimide PI-400 (produced by Ube Industries, Ltd.). Polyimide film 104 had a dielectric constant "$\epsilon$" of 4.2 and a resistivity of $2.6 \times 10^{12}$ $\Omega$·cm. The polyimide film was photoetched conventionally to expose a terminal portion 106 in picture element electrodes 103 as shown in FIG. 1D and FIG. 2D. Because the organic thin film was applied by spin coating, it was necessary to control the spin coating conditions strictly to insure that the film thickness was uniform and to suppress the generation of defects such as pin holes in polyimide film 104.

Figure 1E:
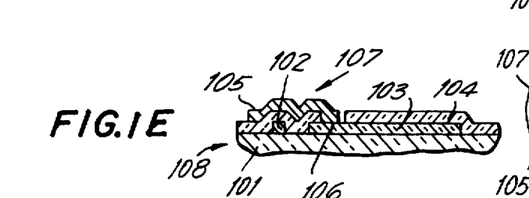
Figure 2E:
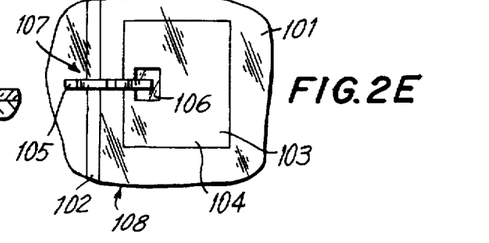

Nickel was deposited across substrate 101 to a thickness of 100 nm and then photoetched to form a plurality of 8 µm wide second conducting strips 105 crossing signal lines 102 and contacting a portion of terminal portions 106 in picture element electrodes 103 as shown in FIG. 1E and FIG. 2E. Second conducting strips 105 are electrically connected to picture element electrodes 103 at picture element terminal portion 106 and extend across thin organic film 104 to overlap first conducting strips 102 and yield a matrix of MIM elements 107, each with a corresponding picture element electrode. The area of MIM element 107 formed where 8 µm wide second conducting strip 105 overlaps 8 µm wide first conducting strip 102 is an 8 µm square. This manufacturing method requires four etching steps to form separately first conducting strip 102, picture element electrode 103, nonlinear electrical conduction layer 104 and second conductor 105 to prepare an active element substrate 108 as shown in FIG. 1E.

The voltage-current characteristics of MIM element 107 were measured. The β index is a measure of the nonlinearity of electric conduction as shown in the Poole-Frankel equation:

$$I = K \cdot V \cdot exp(\beta \cdot V^{1/2}).$$

The β index for MIM element 107 was 5.1. The electrostatic capacity ($C_{MIM}$) of MIM element 107 was $3.7 \times 10^{-14}$ F.

Active element substrate 108 formed as described above and a second transparent substrate having 320 corresponding strip electrodes were subjected to a conventional orientation treatment and assembled into a liquid crystal panel 6 µm apart. A twisted nematic (TN) liquid crystal material having a twist angle of about 90° placed in the panel to form an active matrix liquid crystal electrooptical device 650. The capacity ratio (R) of the apparatus was about 7. Liquid crystal device 650 was driven at a bias ratio of 1/7 and a duty ratio of 1/220, conforming to the driving waveform of an ordinary simple matrix type liquid crystal panel. A contrast ratio of not less than 1:50 was obtained. This is equivalent to the contrast ratio obtained by a static drive liquid crystal panel. The field of view having a contrast ratio of not less than 1:10 was not less than 15° from the vertical and not less than 45° from the horizontal. The apparatus was even capable of being driven at a duty ratio of not less than 1/800 while having a contrast ratio of not less than 1:10 which is suitable for a wide variety of uses.

REFERENCE EXAMPLE

A simple matrix type liquid crystal panel was prepared using the same liquid crystal orientating conditions as in Example 1. However, the panel utilized a substrate that lacked active elements. The substrate included 220 strip electrodes and no active elements. This panel was driven at an optimized bias ratio and the contrast ratio was at most 1:3 and the field of view having a contrast ratio of not less than 1:2 was at most 5° vertically and 8° horizontally.

COMPARATIVE EXAMPLE

For comparison, conventional MIM elements were formed by depositing a first conducting strip of tantalum on a transparent substrate and forming a tantalum pentoxide insulating film of about 50 nm thereon by anodic oxidation. The MIM elements were formed by overlapping a second conducting strip over the $Ta_2O_5$ film. When comparison MIM elements had an area of 8 µm square as in Example 1, the electrostatic capacity was as large as $2.3 \times 10^{-13}$ F and the capacity ratio (R) was only about 2. Accordingly, a liquid crystal electrooptical device including this type of active element did not perform better than the simple matrix liquid crystal panel. It is possible to improve the performance of this comparison MIM element by utilizing, a special driving method, such as by applying a bias to the voltage applied at a non-selected time. When this special driving method was used, the contrast ratio increased to about 1:15 and the field of view having a contrast ratio of 1:10 was about 10° vertically and about 25° horizontally.

When the size of the comparative active MIM element was reduced to an area of a 5 µm square, the capacity ratio increased to about 5. Accordingly, it was possible to operate the resulting liquid crystal electrooptical device with the driving waveform of an ordinary simple matrix type liquid crystal panel. However, the maximum contrast ratio obtained was about 1:20. Accordingly, in order to obtain the excellent performance achieved with the liquid crystal panel of Example 1, a conventional liquid crystal panel must be operated with a special driving method or the MIM elements must be reduced in size substantially.

EXAMPLE 2

Figures 4B, 5B:
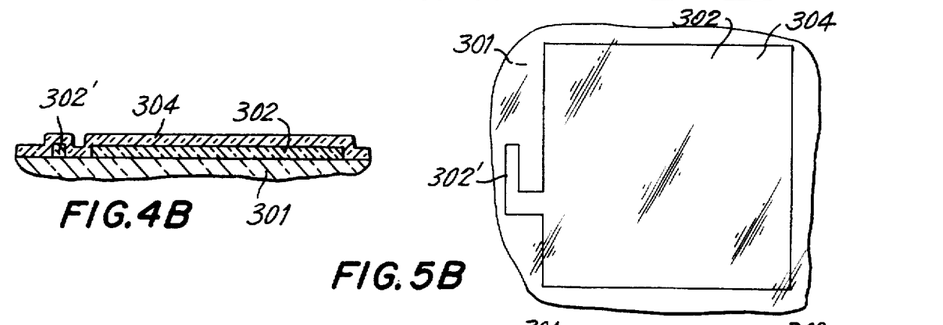
Figures 4C, 5C:
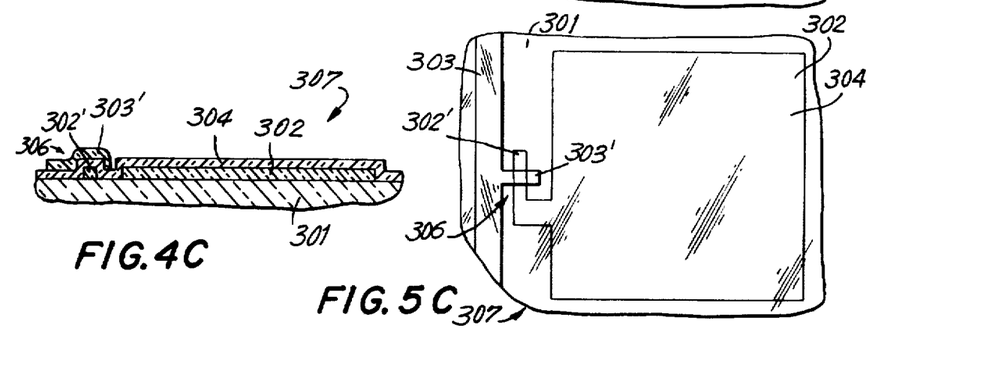

A 30 nm thick ITO film was sputtered onto a transparent substrate 301 of soda-lime glass. The ITO film was photoetched to form a transparent picture element electrode 302 formed with a finger portion 302' to serve as a first conducting strip of a MIM element as shown in FIG. 4A and FIG. 5A. Substrate 301 with picture electrodes 302 served as a starting substrate. A 30 nm thick film of polyimide 304 as in Example 1 was deposited on substrate 301 as shown in FIGS. 4B and 5B. ITO was sputtered across substrate 301 to a 100 nm thick ITO film and photoetched to form a signal line 303 having an arm 303' to serve as a second conducting strip of a MIM element 306 and provide a contact active element substrate 307 as shown in FIGS. 4C and 5C.

A liquid crystal electrooptical device including active element substrate 307 was evaluated. It was confirmed that the apparatus had superior electrooptical characteristics, such as contrast ratio and field of view when compared to certain conventional electrooptical devices without active elements formed in accordance with the invention.

The embodiment described in this Example 2 is advantageous because only two photoetching steps are required. However, it is difficult to form signal lines on nonlinearly conducting layer 303 at a high temperature making it is difficult to lower the electrical resistance of the signal lines. Thus, difficulties may be encountered when attempting to increase the size of an electrooptical device including an active matrix prepared in accordance with this embodiment. In addition, there is an increased rate of defective active elements.

EXAMPLE 3

The organic thin film can be deposited by conventional electrolytic polymerization methods to form a nonlinearly conducting organic polymer thin film on the first conducting strip. Polymerization of the organic thin film on the first conducting strip is induced by electrochemically oxidizing or reducing a monomer on the surface of the first conducting strip, as described in *Chemical Industry*, Vol. 44, No. 6 at pages 462–472, for example. Organic films having different characteristics can be formed by polymerizing different monomers on the first conducting strip.

Figure 6A:
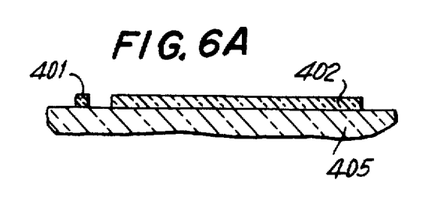
FIGS. 6A, 6B and 6C are sectional views illustrating steps of forming an active element in accordance with another embodiment of the invention.
Figures 6B, 7B:
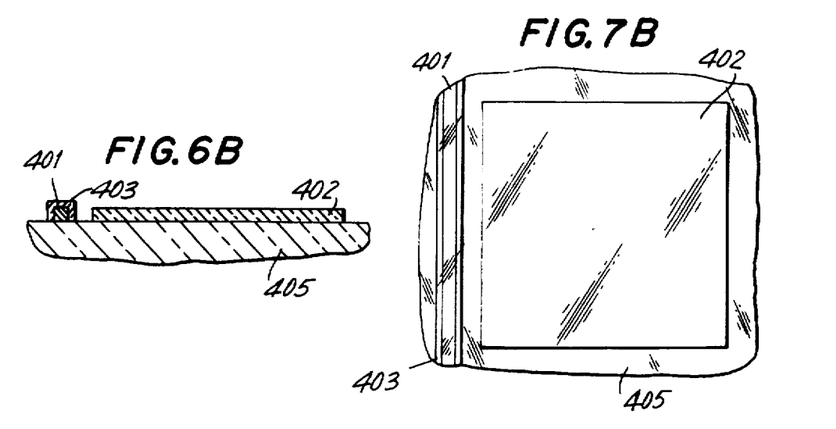
FIGS. 7A, 7B and 7C are plan views illustrating the steps of forming the active element of FIGS. 7A, 7B and 7C.
Figure 7A:
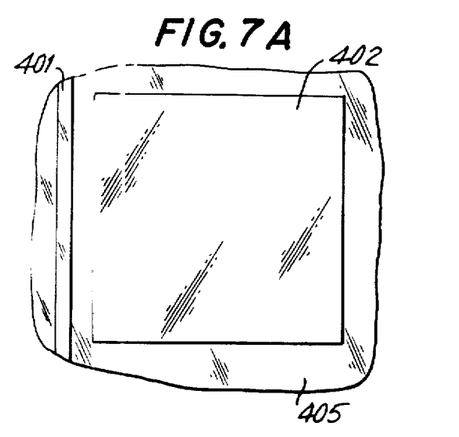

Referring to FIG. 6A and FIG. 7A, a first conducting strip 401 and a picture cell electrode 402 were selectively deposited on a transparent substrate 405 as in Example 1. First conducting strip 401 was coated with a thin polymer film by immersing first conducting strip 401 in an electrolytic solution of acetonitrile containing 0.2 mol/l of aniline with 0.5 mol/l of sodium perchlorate and 0.1 mol/l of pyridine as supporting electrolyte. A potential having a final voltage of 1.1 V on the basis of a saturated calomel electrode was applied between first conducting strip 401 and a saturated calomel electrode (SCE) for 10 minutes. A 50 nm thick organic polymer film of polyaniline 403 was formed on first conducting strip 401 by electrolytic oxidation polymerization of aniline to form a nonlinearly conducting layer 403 as shown in FIGS. 6B and 7B.

Electrochemical techniques such as the above described electrolytic polymerization method are advantageous because the organic film can be selectively formed solely on the first conducting strip. Accordingly, the organic film need not be etched away as in Example 1 which eliminates a photoetching step. The electrochemical depositing technique is further beneficial because the characteristics such as film thickness and electrical conductivity can be highly uniform and reproducible if certain conditions such as the amount of charging are standardized.

Figure 6C:
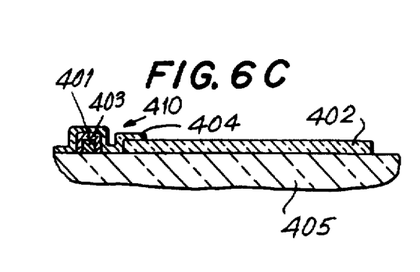
Figure 7C:
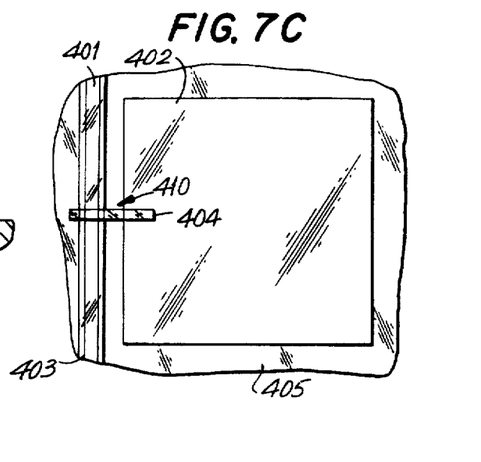

A 100 nm thick film of nickel was deposited and photopatterned to form a second conducting strip 404 extending from picture element electrode 402 over first conducting strip 401 with organic film 403 coated thereon. An 8 μm square MIM element 410 was formed as shown in FIGS. 6C and 7C. The active element of this example is advantageous because only three photoetching steps were required.

The β index from the Poole-Frankel equation, which is a measure of the nonlinearity of electrical conduction in the MIM, was 3.8, the electrostatic capacity ($C_{MIM}$) of the MIM element was $4.5 \times 10^{-14}$ F and the capacity ratio (R) was about 10. A liquid crystal panel similar to the panel described in Example 1 was prepared with the active element prepared in this example 3. When the panel was driven at a bias ratio of 1/7 and a duty ratio of 1/220, a contrast ratio of 1:20 was obtained.

EXAMPLE 4

A 150 nm thick film of ITO was sputtered onto a transparent substrate of soda-lime glass. The ITO film was photoetched to yield a pattern for terminal portions which are electrically connected outside of the substrate. The pattern included first conducting strips of MIM elements, 220 signal lines leading to the MIM elements and leads for a matrix of 220×320 picture element electrodes to yield a starting substrate for an active element substrate.

A polyparaphenylene film was formed on the first conducting strips by electrolytic oxidation polymerization of benzene in a two layer solution of benzene and HF. ITO was deposited on the starting substrate and photoetched to form picture element electrodes and second conducting strips were formed over the first conducting strips with the polyparaphenylene film therebetween.

The first conducting strips utilized in this embodiment are of conductive oxide materials. Conductive oxide materials are advantageous because they are highly resistent to the effects of acid and they may be exposed to acidic electrolytes during electrolytic oxidization polymerization. Accordingly, it is unnecessary to coat the first conducting strips with expensive protective metals such as gold or platinum to prevent corrosion during electrolytic polymerization.

As the size of the substrate and active element matrix increases, the resistance due to the resistance of the signal lines also increases. Metal auxiliary wiring can be included on the substrate to lower the electrical resistance of the signal lines. During formation of the active substrate, the metal auxiliary wiring can be completely covered with an oxide conductor. Accordingly, the metal auxiliary wiring can even be a metal that has low resistance to the corrosive effects of acids as long as it is a metal that can be electrically connected to the electrically conductive oxide film.

EXAMPLE 5

A starting substrate structure including the signal lines, first conducting strips and picture element electrodes was formed as in Example 1. The nonlinearly electrically conducting layer of the MIM element was formed as in Example 3, except that the polyaniline film was 20 nm thick and the MIM had an area of 5 μm square. A liquid crystal panel was assembled as described in Example 1.

The electrostatic capacity of the 5 μm square MIM element was $4.4 \times 10^{-14}$ F and the capacity ratio was about 10 and the β index was 5.9. Due to the high nonlinearity of electric conduction in the MIM element, a contrast ratio of not less than 1:50 was obtained even when a TN type liquid crystal panel was driven at a duty ratio of 1/1000.

The electrolytic polymerization method of depositing the nonlinearly conducting film is advantageous because it reduces the occurrence of defects in the active element matrix. During the electrolytic polymerization method, current flows through any existing defects and this will induce polymerization on the defect to remedy the defect. Accordingly, even if a film as thin as 20 nm is deposited, the resulting active element substrates will almost be defect free.

EXAMPLE 6

The starting substrate of Example 1 was used to assemble an electrooptical device in which the nonlinearly conducting layer of the MIM element was deposited by electrolytic oxidization polymerization in an electrolytic methanol solution containing 0.3 mol/l of sodium hydroxide with 50 mmol/l 2,6-dimethylphenol by applying a potential having a final voltage of 0.5 V on the SCE basis. A second conducting strip was disposed thereon to form a MIM element having an area of 4 μm square and a thickness of about 15 nm. The β index was about 7.8 indicating that this MIM element had extremely high nonlinearity of electrical conduction.

The electrooptical device was assembled with this active element substrate as in Example 4. The capacity ratio "R" was about 9. A contrast ratio of not less than 1:30 was maintained even when the apparatus was driven at a duty ratio of not less than 1/1600.

EXAMPLE 7

A 500 nm thick film of nickel was deposited on a transparent substrate of soda-lime glass. The nickel was patterned to yield 400 terminal portions that are electrically connected outside of the substrate, signal lines and first conducting strips for MIM elements. A 30 nm thick film of ITO was sputtered on the substrate and the ITO film was formed into a matrix of 400×600 picture element electrodes, each 280×310 μm in size. This substrate was used as a starting substrate for forming an active element substrate.

A nonlinearly conducting layer was deposited by electrolytic oxidation polymerization in an electrolytic solution of methanol containing 0.15 mol/l of 2,6-xylenol and 0.15 mol/l of sodium hydroxide as supporting electrolyte. A potential having a final voltage of 0.5 V on the basis of a saturated calomel electrode was applied to the nickel on the substrate for 20 minutes while emersed in the electrolyte. A 40 nm thick film of poly(phenylene oxide) polymer was formed on the first conducting strip. A second conducting strip of nickel was deposited from the picture cell electrode to a position over the first conducting strip with the poly(phenylene oxide) therebetween to yield a MIM element having an area of 10 μm square to form an active element substrate.

A TN type liquid crystal panel was assembled with the active element substrate and an opposing substrate having 640 opposing strip electrodes. A 6 μm thick layer of liquid crystal material with a twist angle of about 90° was provided between the two substrates. The MIM element had a β index of 4.0 and an electrostatic capacity ($C_{MIM}$) of $8.9 \times 10^{-14}$ F and a capacity ratio "R" of about 9. The liquid crystal panel was driven at a duty ratio of 1/400 and had a contrast ratio of not less than 1:30.

EXAMPLE 8

Figure 8A:
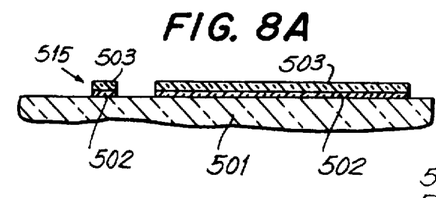
FIGS. 8A, 8B and 8C are sectional views illustrating the steps of forming an active element in accordance with a further embodiment of the invention.
Figure 9A:
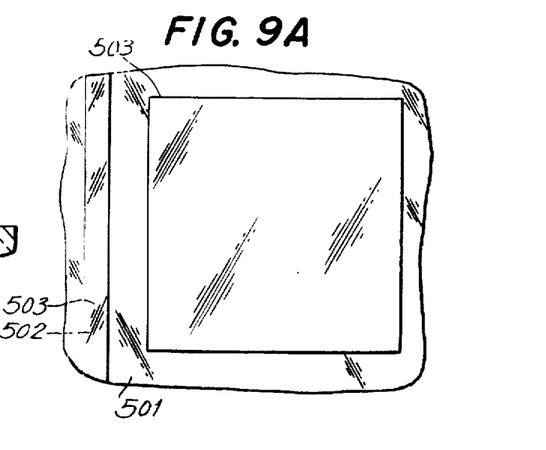

Referring to FIGS. 8A and 9A, a 30 nm thick layer of ITO and a 500 nm thick layer of chromium were sequentially sputtered onto a transparent substrate 501 of soda-lime glass. The ITO was etched to form a first conductive thin layer 502 and the chromium formed a second conductive thin layer 503 of an ITO chromium laminated film first conducting strip 515. Chromium layer 503 was photoetched to form a pattern for terminal portions which are electrically connected to a circuit outside of substrate 501, first conductor layers for a matrix of MIM elements 510, 400 signal lines leading to MIM elements 510 and a 400×600 matrix of picture element electrodes. The ITO was photoetched without removing the resist used during photoetching of the chromium portion to yield a starting substrate for an active element substrate shown in FIGS. 8A and 9A. Preparation in accordance with this embodiment of the invention is advantageous because it reduces by one the number of photoetching steps of Example 1. However, the reduction in photo-etching steps only occurs if the nonlinear electrical conduction layer is applied during the following step. Otherwise, a further patterning step is required. Accordingly, a polyaniline polymer film 504 was formed by electrolytic oxidization polymerization.

Figures 8B, 9B:
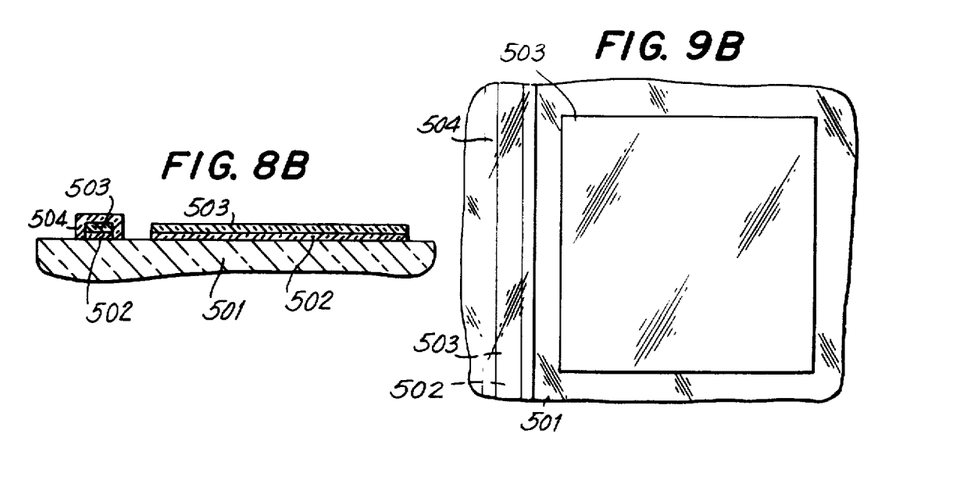
FIGS. 9A, 9B and 9C are plan views illustrating the steps of forming the active element of FIGS. 8A, 8B and 8C.

The starting substrate was immersed in an electrolyte solution of acetonitrile containing 0.2 mol/l of aniline and 0.1 mol/l of pyridine with 0.5 mol/l of sodium perchlorate as a supporting electrolyte. A potential having a final voltage of 1.1 V on the basis of a saturate calomel electrode emersed in the electrolyte was applied to first conducting strip 515 of the original substrate for 10 minutes. A polyaniline polymer film having a thickness of about 50 nm selectively formed a nonlinearly conducting layer 504 on first conducting strip 515 as shown in FIGS. 8B and 9B.

Figure 8C:
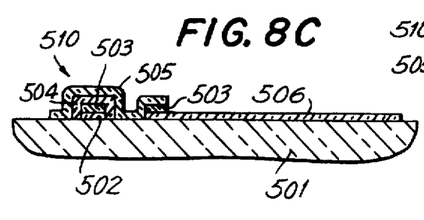
Figure 9C:
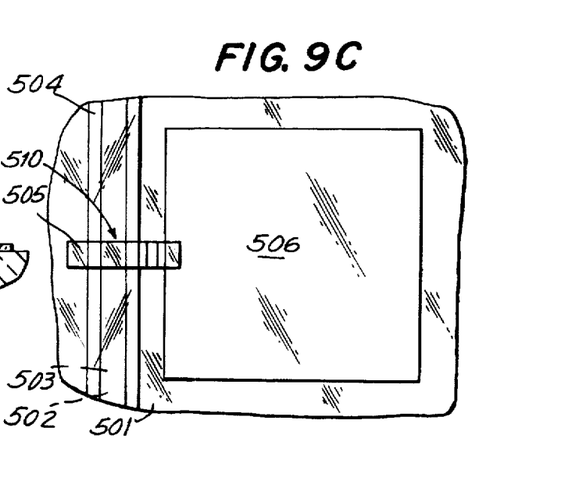

A second layer of chromium was deposited and photoetched to yield a second conducting strip 505 having the same configuration as in Example 5 as shown in FIGS. 8C and 9C. A MIM element 510 was formed and chromium layer 503 was removed from most, if not all of ITO layer 502 to yield a picture element electrode 506. This photoetching step is the last step needed to complete the active element substrate shown in FIGS. 8C and 9C.

If portions of the first conducting strip that are not covered with the organic film are also used as the terminal portion, they must be protected by a resist film or the like during the last photoetching step or the second conductive thin layer 503 of chromium will unintentionally be removed.

It is possible to construct an active element substrate by this method even if an electrical connection cannot occur between the material for the second conducting strip and the material for the picture element electrode as with an aluminum second conducting strip and an ITO picture electrode. By not removing all of the second conductive thin layer 503 from picture element electrode 506 and electrically connecting second conductive strip 505 to the portion of second conductive thin layer 503 remaining on ITO picture element electrode 506, an electrical connection can be made without increasing the number of production steps.

The method of preparing an active element in accordance with this embodiment of the invention is advantageous because it can be used to form an active element substrate that includes a transparent picture element electrode with only two photopatterning steps and three etching steps. Only two masks were required. This reduction in the number of formation steps reduces occurrences of defects in the active element as well as reducing production complexity and costs.

An electrooptical device similar to the device described in Example 5 was prepared with the active element substrate of this Example 8. The electrooptical characteristics such as the contrast ratio and the field of view were improved.

Figure 10:
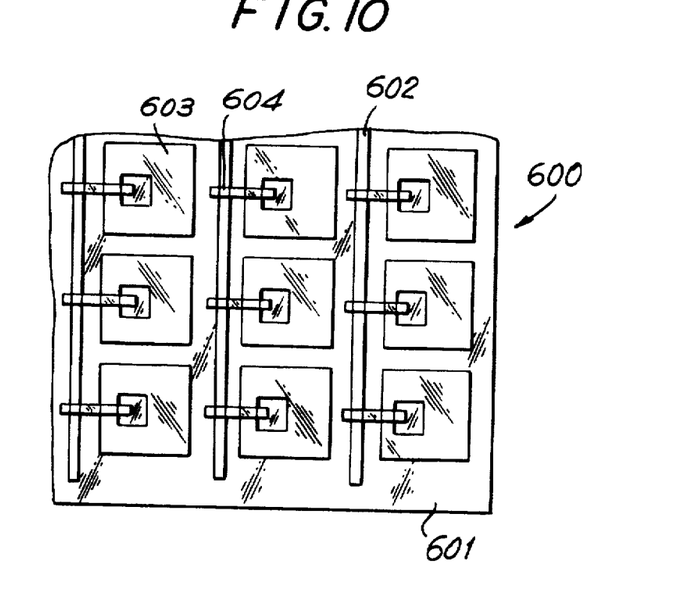
FIG. 10 is a plan view illustrating the MIM elements and picture electrodes of FIGS. 8 and 9 on an active matrix substrate.

A liquid crystal display device utilizing the MIM elements prepared in accordance with the invention in an active matrix substrate 600 is shown in FIG. 10. Active matrix substrate 600 includes a transparent substrate 601 having a plurality of column or row electrodes 602 and a plurality of transparent picture cell electrodes 603. Each picture cell electrode 603 is electrically connected to column or row electrode 602 by a MIM 604.

Figure 11:
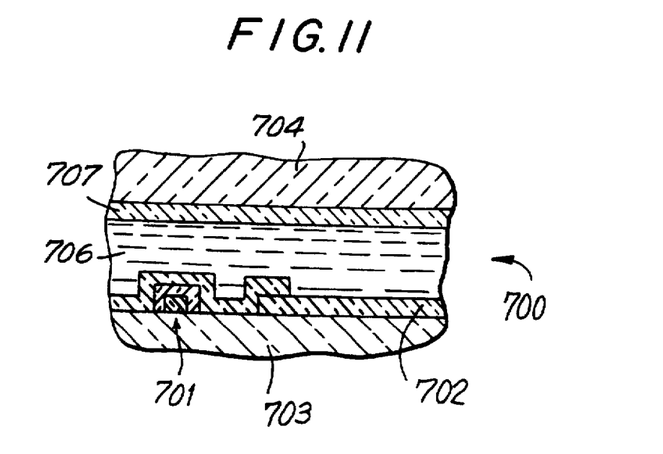
FIG. 11 is a cross-sectional view of a twisted nematic liquid crystal display device including the MIM elements constructed and arranged in accordance with the invention.

An assembled liquid crystal display device 700 is illustrated in FIG. 11. Liquid crystal display device 700 includes a MIM 701 for each corresponding picture cell electrode 702 formed on a lower transparent substrate 703. An upper opposed transparent substrate 704 is disposed adjacent to lower substrate 703 which is the active matrix substrate and a liquid crystal material 706 is disposed in the space between substrates 703 and 704. In the usual manner when a picture cell electrode is selected and the voltage between an electrode 707 on upper substrate 704 and picture cell 702 is above the threshold voltage, the liquid crystal material 706 disposed therebetween is rendered visually distinguishable from the remaining liquid crystal material in order to present the desired display.

Various modifications can be made to the preferred embodiments which have been described while still achieving objects and advantages of the invention. For example, additional monomers can be polymerized to form the nonlinearly conducting layer, such as: aromatic compounds having at least one amino group in addition to aniline; phenol derivatives in addition to 2,6-xylenol; heterocyclic compounds such as pyrol, thiophene and furan; condensed aromatic polynuclear hydrocarbons such as benzene, azulene and pyrene and derivatives thereof; vinyl compounds such as vinyl pyridine and derivatives thereof; and acetylene and derivatives thereof. The nonlinear conducting characteristics of the MIM element can be varied by changing the components of the nonlinearly conducting layer as well as changing the electrolytic polymerization conditions.

Additional conducting materials can be substituted for the previously described first and second conductive strip. For example, various metals including indium, magnesium, aluminum, zinc, iron, manganese, chromium, nickel, cobalt, tantalum, tungsten, molybdenum, titanium, lead, copper, silver, gold, platinum, rhodium and palladium can be used alone or in alloy or mixture form and with other metals. The metal conducting layers are preferably formed by vacuum evaporation or sputtering but other deposition methods can also be used. Semiconductors, oxide conductors and organic conductors can also be included as the conducting layers as long as they do not have unsuitably high resistance so that they do not interfere with activation of the active element.

The active element prepared in accordance with the invention may be advantageously used in many optical devices, in addition to a TN type liquid crystal element. For example, active elements constructed in accordance with the invention are suitably included in other devices that produce a change in optical characteristics through a change in voltage. For example, a liquid crystal electrooptical elements can be combined with a liquid crystal of a guest-host mode, phase transition mode, diffusion mode using a micro capsule, supertwist birefringence mode, electric field controlling birefringence mode, a mode including a ferroelectric liquid crystal and so forth. In addition, the active element in accordance with the invention can be combined with an electrochromic element or an element that changes the transmittance and the reflectance of an optical element due to electrophoresis in the same way as a liquid crystal electrooptical element and an element which is self-luminous such as an electroluminescent element and a plasma display element. An active element in accordance with the invention is further applicable to electrooptical elements such as character displays, graphic displays, animation displays and optical shutters.

The organic film of a MIM element prepared in accordance with the invention generally has a dielectric constant that is as small as about 3 to 4. This is not more than 1/5 of the dielectric constant of a conventional tantalum pentoxide film produced by ionization of a tantalum strip. Consequently, the electrostatic capacity of an electrooptical apparatus including a MIM element having such a low dielectric constant will be low, not more than 1/5 of an apparatus having a MIM element including a tantalum pentoxide film of the same dimensions. Accordingly, the same electrostatic capacity will be achieved with an element having the same film thickness and not less than five times the area. Because the precise MIM area limitations of an active element constructed in accordance with the invention are less critical than with a MIM element having a nonlinearly conducting layer with a higher dielectric constant for the same dimensions, the accuracy of the photoetching pattern need not be as high. This less critical size limitation leads to fewer defective elements and reduces the cost of preparing the active element substrate.

MIM elements that include inorganic films having the same dimensions as a MIM element with a tantalum pentoxide film can be constructed with thinner films of not more than 1/5 the thickness and obtain the same electrostatic capacity. Thus, the nonlinear characteristics of a MIM element constructed in accordance with the invention is enhanced as are characteristics of an electrooptical apparatus including said MIM element.

Coating the first conductive layer of the MIM with an organic thin film by the electrolytic polymerization method has advantageous. A uniform organic thin film having a thickness of from about several nm to several μm can be formed on the conductive electrode with high reproducibility. It is simple to control the nature and characteristics of the thin film by varying the kind of monomer employed as well as by varying electrolytic conditions and the like. Accordingly, MIM elements constructed in accordance with the invention having nonuniform characteristics are extremely rare. This further reduces production costs.

The method of producing an active matrix to be included in an electrooptical devices and apparatuses in accordance with the invention is relatively simple. The active element substrate can be formed in two or three photoetching steps. This reduction of steps increases the yield as well as reducing the cost.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method of forming a two-terminal conductor—nonlinear conductor—conductor active element for an electrical device, on a substrate, comprising the steps of:

selectively disposing a first layer of electrically conductive material on a substrate;

immersing the first layer in an electrolytic solution containing electrolytically polymerizable material;

applying voltage to the first layer to selectively deposit a layer of non-linearly conductive material, including organic material, on the first layer, by electrolytic polymerization, to a thickness of about 15 nm to about 50 nm;

selectively disposing a second electrically conductive layer on at least a portion of the non-linearly conductive layer at a position opposed to the first conductive layer with the nonlinearly conductive layer therebetween.

2. The method of claim 1, wherein the active element is a MIM.

3. The method of claim 1, wherein the nonlinearly conductive layer has not more than 1/5 the dielectric constant of a tantalum pentoxide layer produced by anodization of a tantalum strip.

4. A method of forming a two terminal active matrix substrate for an electrooptical device, comprising:

selectively disposing a first layer of electrically conductive material on a substrate;

selectively disposing a plurality of picture element electrodes in a matrix of columns and rows on the substrate;

electrochemically selectively depositing a layer of nonlinearly electrically conductive material including an organic material on the first layer; and selectively disposing a second layer of electrically conductive material on at least a portion of the nonlinearly electrically conductive material at a position opposed to the first layer with the nonlinearly electrically conductive material therebetween, and the second conductive layer being electrically coupled to the picture element electrodes.

5. The method of preparing an active matrix substrate of claim 4, wherein the second electrically conductive layer is disposed in the form of a strip adjacent to a column or row of picture element electrodes and the second electrically conductive layer is electrically connected directly to each picture element electrode.

6. The method of claim 4, wherein the active element is a MIM.

7. The method of claim 4, wherein the first layer is formed as a series of conductive strips adjacent columns of the picture element electrodes; the strips are coupled to an external voltage source; the nonlinearly conductive material is formed on the strips; and the second conductive layer is in the form of a lead extending from the picture element electrodes to the nonlinearly conductive layer and a portion of the lead opposes the conductive strips with the nonlinearly conductive material therebetween.

8. The method of claim 6, wherein the first layer is formed as a series of conductive strips adjacent columns of the picture element electrodes; the strips are coupled to an external voltage source; the nonlinearly conductive material is formed on the strips; and the second conductive layer is in the form of a lead extending from the picture element electrodes to the nonlinearly conductive layer and a portion of the lead opposes the conductive strips with the nonlinearly conductive material therebetween.

9. A method of forming an active matrix substrate, comprising:

disposing a layer of a first conductive material on a substrate;

disposing a layer of a second conductive material on the layer of first conductive material;

selectively removing portions of the first and second layers from the substrate to form a matrix of two layer picture element electrodes adjacent two layer conductive strips, the two layers being the second material on the first material;

immersing the substrate in an electrolyte solution and selectively depositing a layer of a nonlinearly conductive material on the conductive strips by electrolysis from the electrolyte solution;

selectively disposing a top layer of conductive material as a conductive lead from the layer of nonlinearly conductive material to the picture electrode to yield a two-terminal device in which current can flow through the nonlinearly conductive material regardless of the polarity of voltage applied across the nonlinearly conductive material.

10. The method of forming an active element of claim 9, wherein the nonlinearly conductive layer is formed to a thickness of about between about 20 nm and 50 nm.

11. The method of forming an active element of claim 9, wherein the first conductive material is ITO and the second conductive material of the picture electrode is removed from substantially all of the ITO layer, except for a portion under the conductive lead.

12. The method of forming an active element of claim 9, wherein the nonlinearly conductive layer is deposited by electrolytic polymerization.

13. The method of forming an active element of claim 12, wherein the active element is a MIM.

* * * * *